United States Patent
Lee (10) Patent No.: US 7,355,464 B2
(45) Date of Patent: Apr. 8, 2008

(54) APPARATUS AND METHOD FOR CONTROLLING A DELAY- OR PHASE-LOCKED LOOP AS A FUNCTION OF LOOP FREQUENCY

(75) Inventor: Seong-Hoon Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 60 days.

(21) Appl. No.: 11/124,743

(22) Filed: May 9, 2005

(65) Prior Publication Data

US 2006/0250171 A1 Nov. 9, 2006

(51) Int. Cl.
*H03L 7/06* (2006.01)
(52) U.S. Cl. .................... 327/158; 327/159
(58) Field of Classification Search .......... 327/156, 327/158
See application file for complete search history.

(56) References Cited

U.S. PATENT DOCUMENTS

| | | | |
|---|---|---|---|
| 5,771,264 A * | 6/1998 | Lane | 375/376 |
| 5,910,740 A * | 6/1999 | Underwood | 327/149 |
| 6,628,154 B2 * | 9/2003 | Fiscus | 327/158 |
| 7,002,384 B1 * | 2/2006 | Chong et al. | 327/158 |
| 7,042,258 B2 * | 5/2006 | Booth et al. | 327/115 |
| 7,046,061 B2 * | 5/2006 | Kwak | 327/158 |
| 7,078,950 B2 * | 7/2006 | Johnson | 327/158 |
| 2005/0195004 A1* | 9/2005 | Kim | 327/158 |

* cited by examiner

*Primary Examiner*—Kenneth B. Wells
*Assistant Examiner*—Ryan C. Jager
(74) *Attorney, Agent, or Firm*—Wong, Cabello, Lutsch, Rutherford & Brucculeri, LLP (57) ABSTRACT

A method and circuitry for a Delay Locked Loop (DLL) or a phase Locked Loop (PLL) is disclosed, which improves the loop stability at high frequencies and allows maximum tracking bandwidth, regardless of process, voltage, or temperature variations. Central to the technique is to effectively operate the loop at a lower frequency close to its own intrinsic bandwidth (1/tLoop) instead of at the higher frequency of the clock signal (1/tCK). To do so, in one embodiment, the loop delay, tLoop, is measured or estimated prior to operation of the loop. The phase detector is then enabled to operate close to the loop frequency, 1/tLoop. In short, the phase detector is made not to see activity during useless delay times, which prevents the loop from overreacting and becoming unstable.

34 Claims, 7 Drawing Sheets

Transfer Functions:

$$\frac{\varphi 1}{\varphi in} = \frac{z(1 + Kd*L(z))}{z + Kd*L(z)}$$

$$\varphi 2 = z^{-1} * \varphi 1$$

$$\frac{\varphi 2}{\varphi in} = \frac{1 + Kd*L(z)}{z + Kd*L(z)}$$

$$\frac{\varphi 1}{\varphi in} = \frac{z^{m+1}(1 + Kd*L(z))}{z^{m+1} + Kd*L(z)}$$

$$\varphi 2 = z^{-1} * \varphi 1$$

$$\varphi 3 = z^{-m} * \varphi 2 = z^{-(m+1)} * \varphi 1$$

APPARATUS AND METHOD FOR CONTROLLING A DELAY- OR PHASE-LOCKED LOOP AS A FUNCTION OF LOOP FREQUENCY

FIELD OF THE INVENTION

Embodiments of this invention relate to delay- or phase-locked loops, and particularly to circuits of that type with increased stability.

BACKGROUND

It is often desired in an integrated circuit to delay a signal. In the context of a periodic signal like a clock signal, adjustment of delay can be understood as an adjustment of the phase of the signal. Such phase shifting of a clock signal can be achieved by use of delay lock loops (DLLs) or phase lock loops (PLLs) that are used to generate internal clock signals for an integrated circuit from a master clock signal. Because of the complexity of modern-day integrated circuits, the ability to finely shift the phase of clock signal is particularly important to ensure proper timing within the circuit. For example, DLLs or PLLs are used to set the data output timing in high speed Dynamic Random Access Memories (DRAMs).

Figure 1:
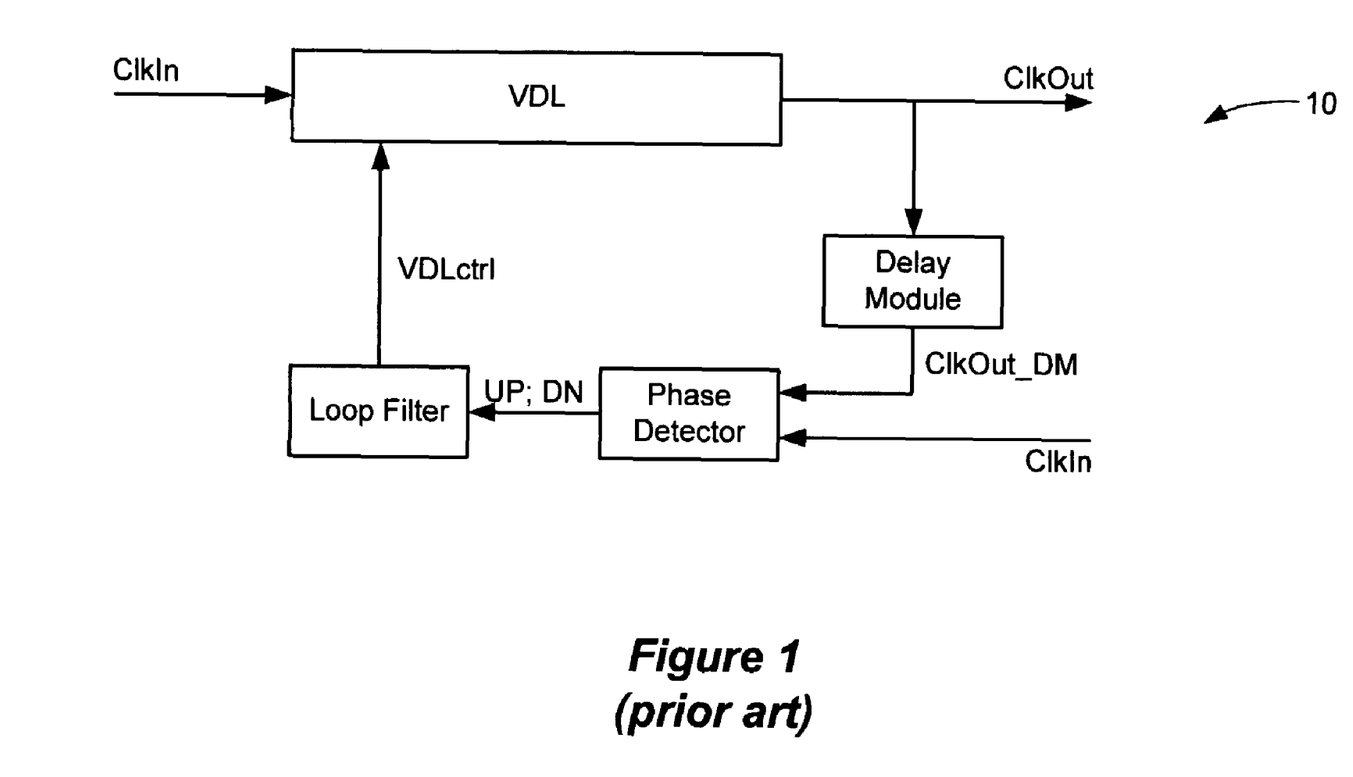
FIG. 1 illustrates a prior art delay locked loop (DLL) with a delay module among other components.

A typical analog DLL 10 is shown in FIG. 1. As shown, the DLL 10 derives an output clock signal (ClkOut) from an input clock signal (ClkIn), in which the phase between the two can be tightly controlled. The DLL comprises a variable delay line (VDL) whose delay (tVDL) is controllable given the analog value of a control signal (VDLctrl), and a fixed delay circuit, namely Delay Module (or DM). The output of the delay module (ClkOut_DM) and the ClkIn signals are compared at a phase detector (PD), which essentially determines whether one of the two input signals (ClkIn; ClkOut_DM) are lagging or leading the other, and seeks to bring these two phases into alignment. For example, if ClkOut_DM leads ClkIn, then the phase detector outputs a "down" signal (DN) to reduce the value of VDLctrl, which increases tVDL; if ClkOut_DM lags ClkIn, then the phase detectors outputs an "up" signal (UP) to increase the value of VDLctrl, which decreases tVDL. The bandwidth of the loop is determined in accordance with a loop filter (LF), which in an analog circuit can comprise resistor-capacitor circuits (e.g., an R-C filter). Moreover, and although not shown, the loop filter may comprise a charge pump. In any event, by virtue of the delay module, the output clock signal ClkOut will precedes the input clock signal ClkIn by its delay (tDM). Of course, the DLL circuit 10, may also be digital in nature, with the loop filter being replaced by a digital control, and wherein VDLctrl comprises digital outputs to the VDL (not shown).

In general, and assuming the period of ClkIn is tCK, the loop in DLL circuit 10 establishes a relationship of tVDL+tDM=N*tCK, where N equals the smallest possible integer. Because tVDL is usually not larger than tCK, N is primarily determined by tDM, i.e., the delay through the delay module. Though tDM is a fixed value at given conditions, N is still variable inversely proportional to tCK.

When the delay of the delay module, tDM, is larger than the clock period, tCK, the transfer function of the loop increases in complexity, and instability can result, as will be shown below. Moreover, such problems are worse as the clock frequency increases (i.e., tCK decreases), or as tDM increases. Furthermore, because tDM can vary as a result of process, temperature, or voltage variations, such instability can be particularly hard to control from device to device.

Figure 2:
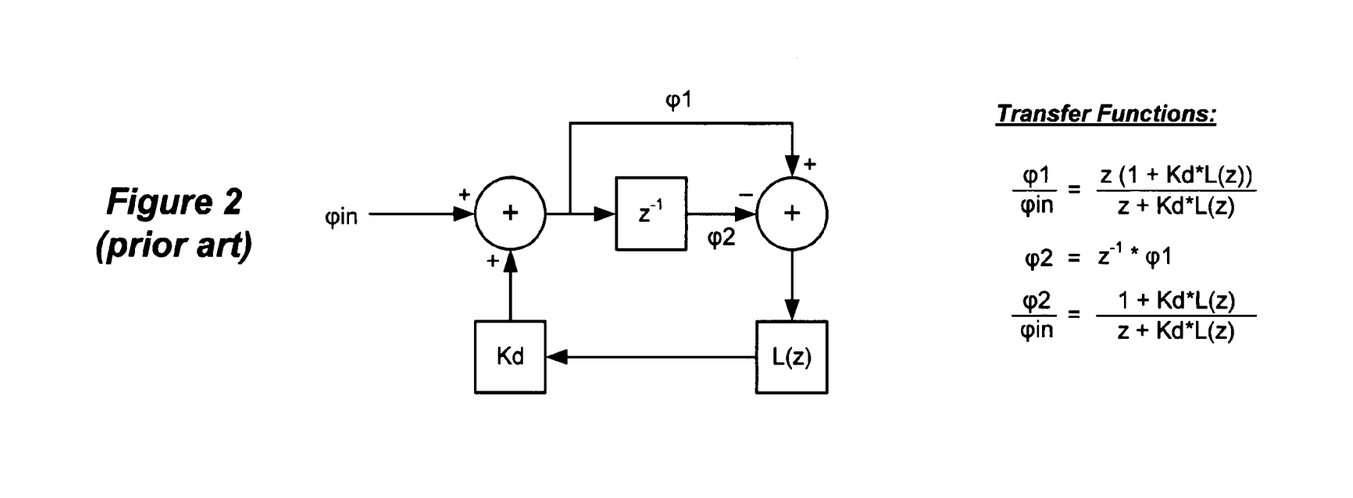
FIGS. 2 and 3 illustrate the transfer functions of the DLL of FIG. 1 with and without consideration of the delay module.
Figure 3:
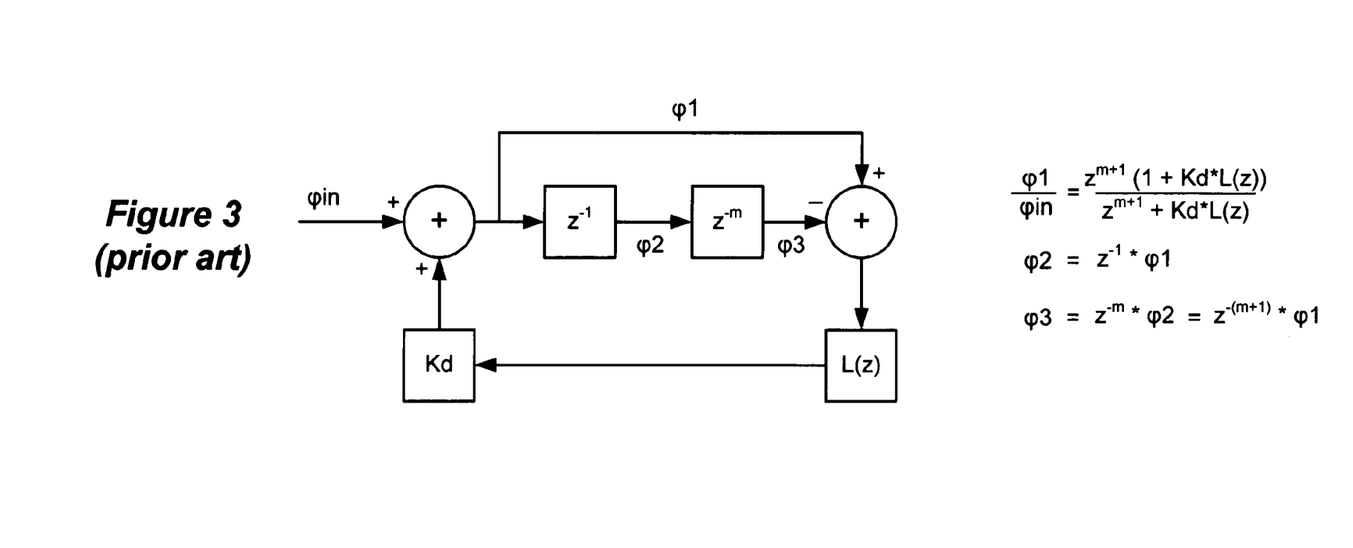

FIGS. 2 and 3 shows Z-domain modeling of analog DLL circuit 10 with (FIG. 2) and without (FIG. 3) a delay module (DM). Kd is the gain for the VDL, and L(z) is the transfer function of charge pump and loop filter. The $z^{-1}$ block represents the fact that the phase detector compares the current input clock edge with the VDL output derived from the previous input clock edge. In other words, the $z^{-1}$ block represents one clock cycle delay (tCK). The DM, by contrast, is represented by a $z^{-m}$ block (FIG. 3), meaning that the DM delays by m cycles.

As seen in the figure, the transfer function of FIG. 2 (without the delay module) is a first order system of z, and optimal parameters (Kd, R, C, etc.) for the circuit can be solved with ease. However, the addition of the delay module, as shown in FIG. 3, causes a significant difference. Here, the resulting transfer function is represented by the (m+1)th order of z. It is very difficult to achieve an analytic solution such a high-order system.

Figure 4:
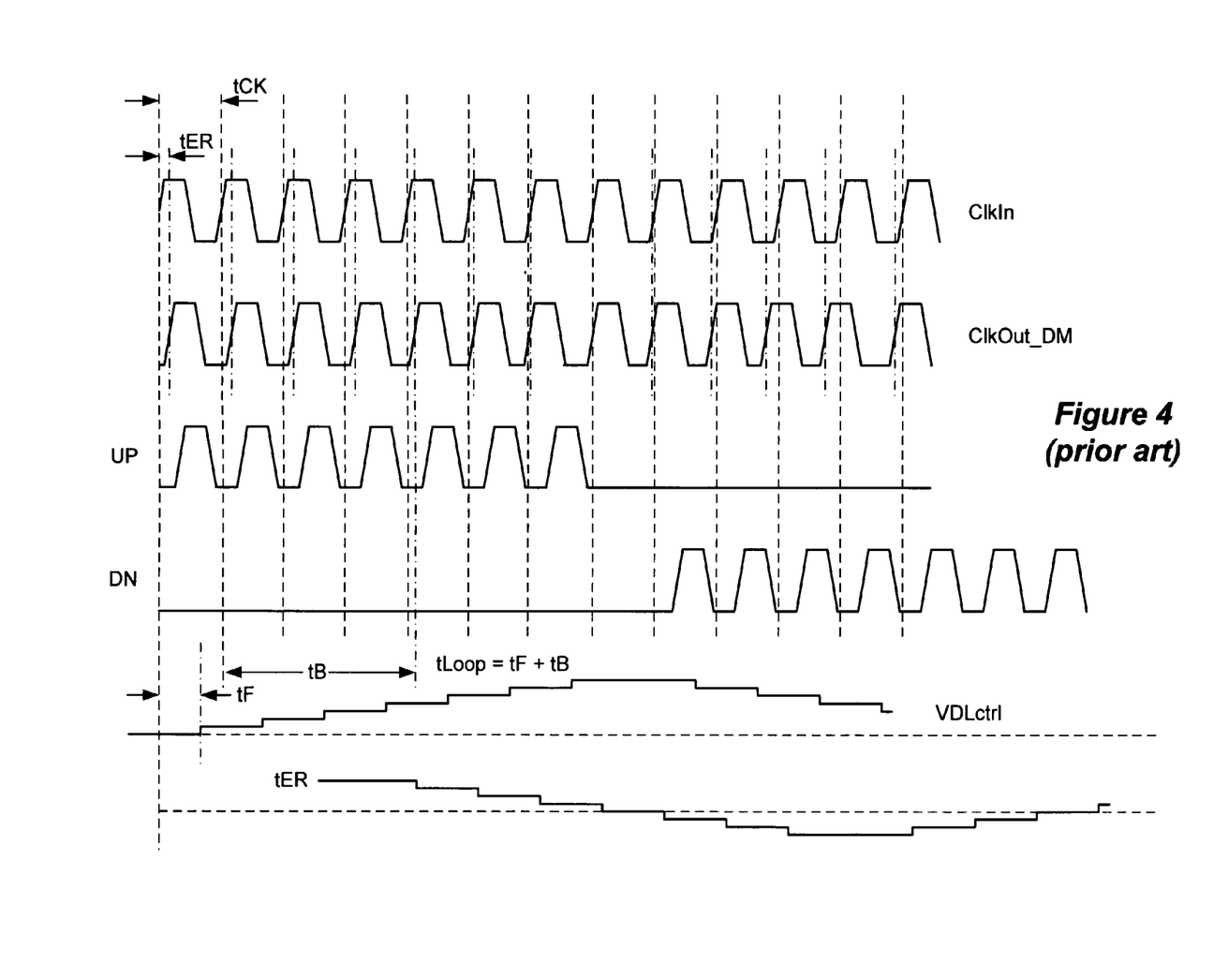
FIG. 4 illustrates instability and oscillation that can result in use of the DLL of FIG. 1 when long delays are used in the delay module.

As a result, and as alluded to above, a DLL circuit 10 with a relatively high tDM can be unstable, as shown in FIG. 4. As shown, the total delay time of propagation through the loop, tLooP, is about four cycles for an example, and equals the sum of tF and tB, where tF equals the propagation delay though the phase detector (tPD) plus the propagation delay through the loop filter (tLF), and tB=the propagation delay through the VDL (tVDL) plus the propagation delay through the delay module (tDM) (i.e., tF=tPD+tLF; tB=tVDL+tDM). tVDL is generally not larger than tCK, and tF is usually negligible for an analog DLL design, and is shown exaggerated in FIG. 4. (tF may however not be negligible for digital filters). In short, it is largely due to tDM that the delay through the loop can be longer than a single clock cycle.

In FIG. 4, a timing error (tER) between ClkIn and ClkOut_DM is shown. Because initially ClkIn leads ClkOut_DM, UP pulses are needed to try and bring them into alignment. Each UP pulse increases an analog value of the VDL's analog control signal, VDLctrl, which decreases tVDL; each down pulse (DN) achieves the opposite effect. (Fixed pulse widths for UP and DN are assumed for simplicity of explanation).

However, notice that it takes significant time (i.e., tLooP) for the output of the phase detector (UP; DN) to take effect through the loop so as to update the phase at the input of the phase detector. In the mean time, before this change in phase is effected, the phase detector continues to generate the same signals (initially, UP in FIG. 4) and does so at every clock period, regardless of whether they are needed or not, and despite that the fact that any phase shift wrought by earlier signals is not yet known. Thus, in the example of FIG. 4, four UP pulses are output before any change in phase (tER) is registered. This discrepancy in frequency between the clock frequency (1/tCK) and the loop frequency (1/tLooP) causes the loop to overreact and become unstable. Specifically, the timing error, tER, does not converge but oscillates. The amplitude and period of the oscillation depends on the loop gain and the loop delay (tLooP).

The conventional solution to this problem involved decreasing the loop's gain and/or reducing the loop's bandwidth. This can be accomplished by increasing loop filter's resistance-capacitance values (assuming an analog circuit), reducing the charge pumping current, or increasing the size of the loop filter. But these solutions can consumes larger layout areas and can considerably decreases the tracking bandwidth (i.e., loop gain divided by loop delay), resulting in a longer time to achieve a phase "lock." In short, such previous approaches involved undesirable trade offs between maximum frequency performance, stability, tracking bandwidth, and layout area. A better solution is therefore needed.

SUMMARY

A method and circuitry for a Delay Locked Loop (DLL) or a phase Locked Loop (PLL) is disclosed, which improves the loop stability at high frequencies and allows maximum tracking bandwidth, regardless of process, voltage, or temperature variations. Central to the technique is to effectively operate the loop at a lower frequency close to its own intrinsic bandwidth (1/tLoop) instead of at the higher frequency of the clock signal (1/tCK). To do so, in one embodiment, the loop delay, tLoop, is measured or estimated prior to operation of the loop. The phase detector is then enabled to operate close to the loop frequency, 1/tLoop. In short, the phase detector is made not to see activity during useless delay times, which prevents the loop from overreacting and becoming unstable. Thus, a loop with the proposed method can operate stably at any frequency, and without increasing the loop filter resistance-capacitance values or decreasing loop bandwidth, such that tracking bandwidth and layout area are not sacrificed. In short, use of the disclosed technique requires no trade off between maximum frequency, stability, and tracking bandwidth.

BRIEF DESCRIPTION OF THE DRAWINGS

Embodiments of the inventive aspects of this disclosure will be best understood with reference to the following detailed description, when read in conjunction with the accompanying drawings, in which.

DETAILED DESCRIPTION

Figure 5:
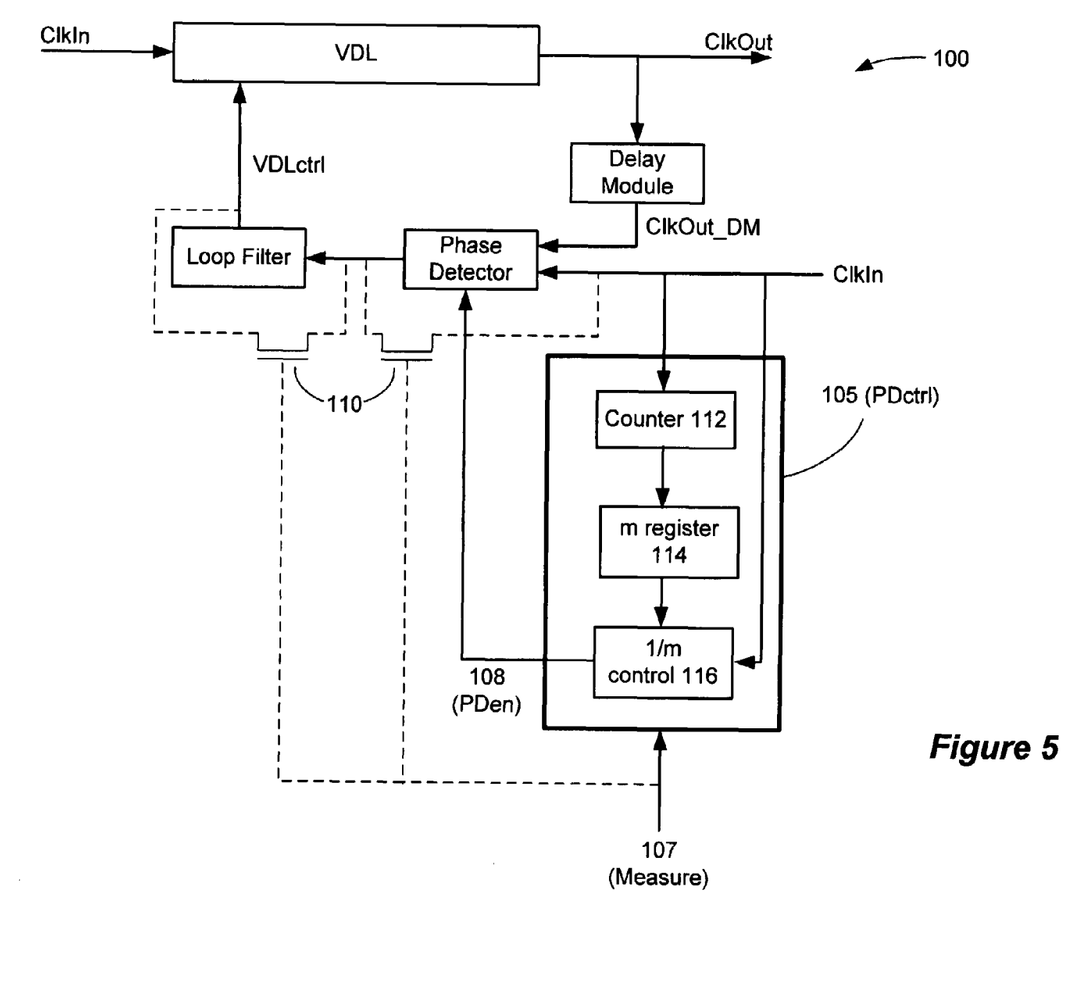
FIG. 5 illustrates an embodiment of the improved DLL, including use of a phase detector controller.
Figure 8:
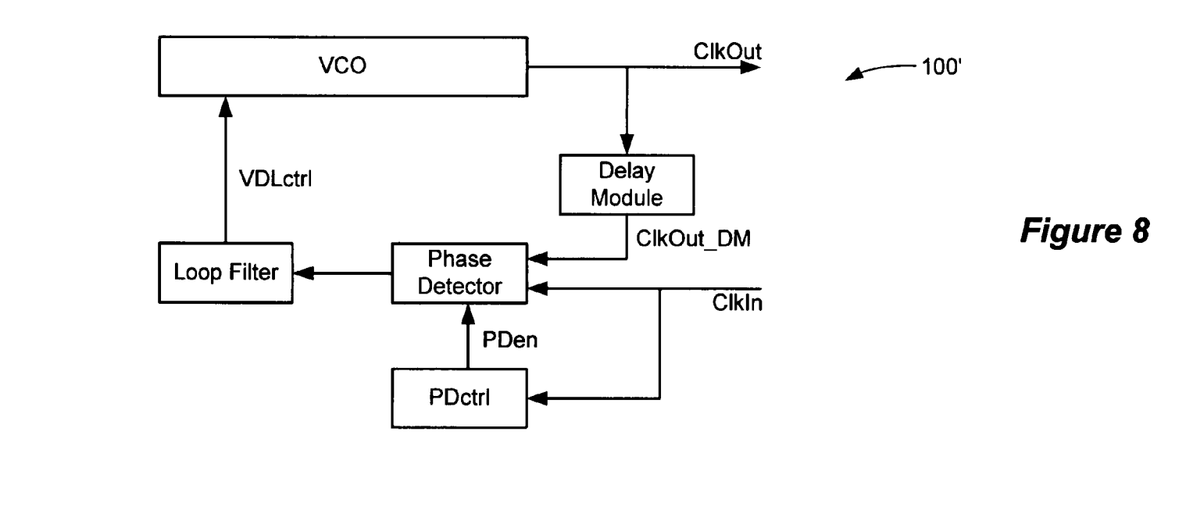
FIG. 8 illustrates an embodiment of the invention in the context of a phase-locked loop (PLL).

The disclosed scheme uses smart filtering to remove the discrepancy between the loop frequency (1/tLoop; delay in propagation through the loop) and the higher clock frequency (1/tCK) by activating the phase detector to work at a rate closer to the loop frequency. FIG. 5 shows one embodiment for achieving this goal in the context of an improved analog DLL circuit 100. However, the improvements are equally applicable when applied to digital DLL, or to PLL 100' (FIG. 8), which uses a variable oscillator (VCO) to generate a clock signal whose phase and frequency are locked to those of the input clock, ClkIn.

As shown in FIG. 5, a phase detector control block, PDctrl 105, has been added to the DLL circuit. It includes a counter 112, register 114, and a controller 116 which together are useful in measuring the loop frequency and ultimately in controlling the phase detector in accordance with the loop frequency.

In a preferred embodiment, the loop frequency, 1/tLoop, is measured prior to operation of the DLL circuit 100. This is preferred, because the loop frequency can vary with process, voltage, and temperature variations, and can also vary in accordance with the input frequency. Thus, by measuring the loop frequency, a reliable value is acquired which is tailored to the unique environment in which the DLL circuit 100 is used. However, it is not strictly necessary in all useful embodiments to first measure the loop frequency prior to using the same to control the DLL circuit. Instead, if the loop frequency is known or otherwise ascertainable, it can merely be used without the measuring step.

Figure 6:
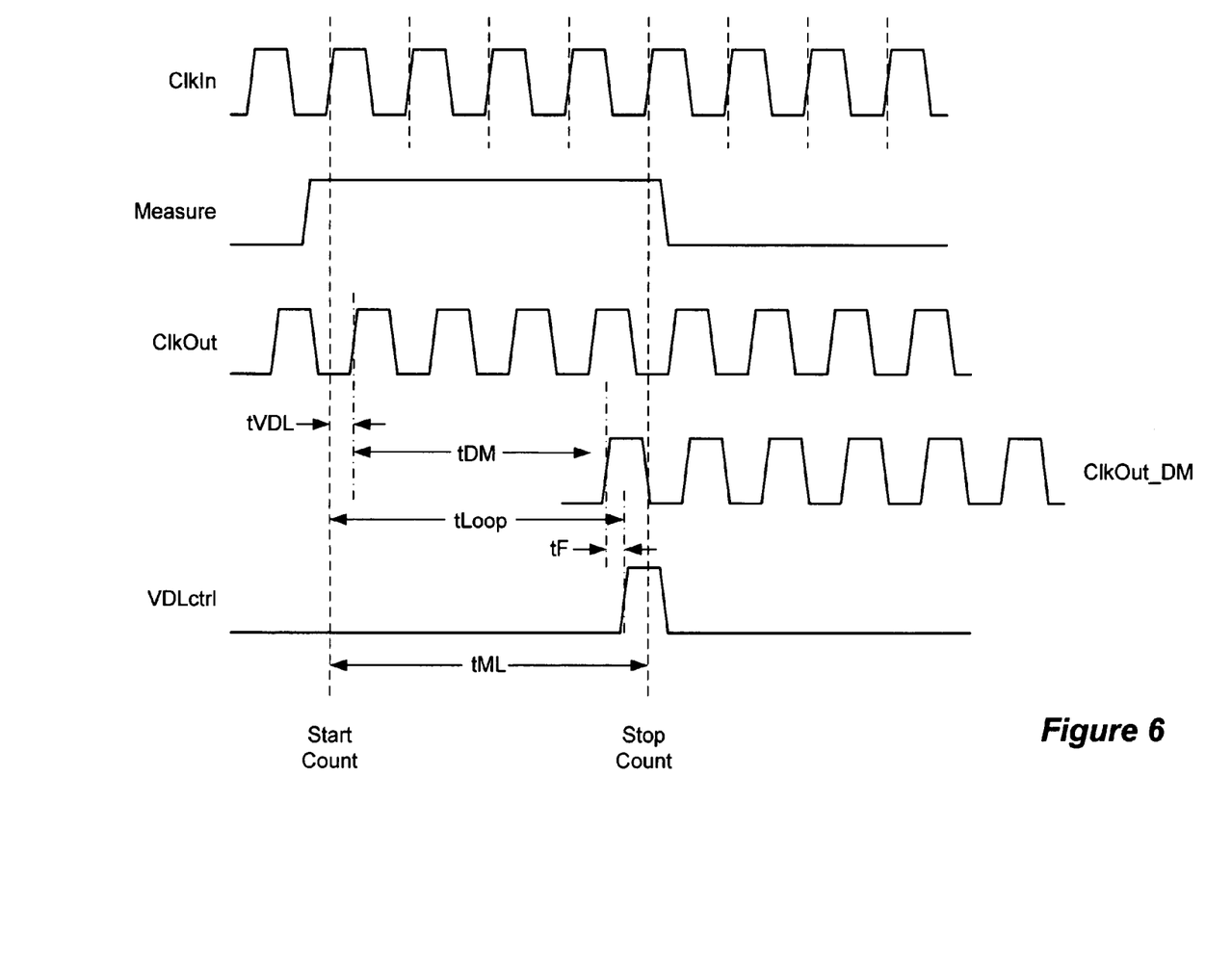
FIG. 6 illustrates timing diagrams used during a measuring period, in which the loop delay for the improved DLL circuit of FIG. 5 is measured or estimated.

FIG. 6 shows the timing diagrams used during the loop frequency measuring step. Basically, this step measures the time it takes for an input pulse (ClkIn) to pass through the loop. As shown, a measure signal is used to enable the measuring function. It is preferred during measuring that the phase detector and loop filter circuits (FIG. 5) should be rendered transparent such that input signals received are merely passed to the outputs of these blocks. However, if this is not easy or practical, then the blocks can be by-passed altogether, such as with the use of transmission gates 110. While by-passing the phase detector and loop filter will cause the measured delay through the loop to be slightly smaller than normal, such small skew in the measurement is satisfactory as the delays in the phase detector and loop filter (i.e., tF=tPD+tLF) are generally negligible (see FIG. 6). The measure signal can be self-generated by the PDctrl 105 block, or can be provided by another logic circuit such as a microcontroller which would normally be on the integrated circuit as the DLL circuit 100.

Referring again to FIG. 6, when the measure signal goes high, and after detecting a first ClkIn pulse, counter 112 start counting the number of subsequent ClkIn pulses up until the time that a pulse is detected at ClkOut_DM. After such detection takes place, the circuit waits for the next ClkIn pulse, taking this "last" ClkIn pulse as the end of the measuring period. Therefore, the measure signal can be disabled. As shown, the measured delay, tML, spans between the first and last ClkIn pulses in the measuring period, which is slightly longer than the actual loop delay, tLoop, but still comprises a useful measure of the loop delay (i.e., tML~tLoop). In any event, the measured period can be viewed as a number of cycles of the input clock, m, which in the example of FIG. 6 equals 4 (i.e., m*tCk=tML~tLoop). This measured value of m—the approximate ratio between the clock and loop frequencies—is stored in the register 114 for use in controlling the phase detector during normal operation of the DLL 100, as is explained next with reference to FIG. 7.

Figure 7:
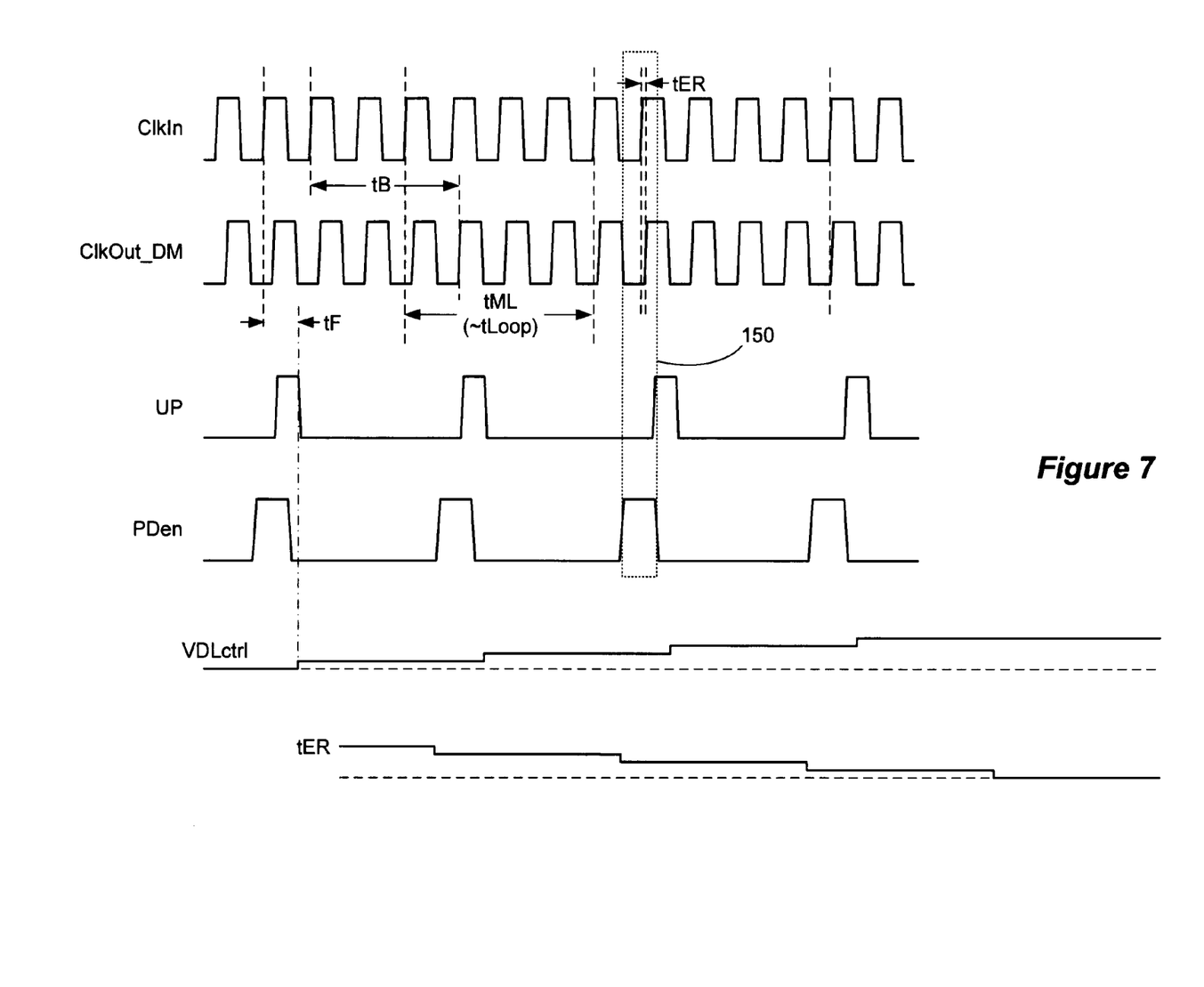
FIG. 7 illustrate timing diagrams for the DLL circuit of FIG. 5, showing selective enablement of the phase detector in accordance with the loop frequency, and no oscillations or instabilities.

During normal operation, the phase detector is only enabled once during each period of the measured (or otherwise provided) loop frequency, i.e., once every tML. Specifically, 1/m controller 116 is used to process the input signal, ClkIn, by frequency dividing that signal by m, i.e., to remove all but every m-th pulse in the train to produce a phase detector enable signal PDen. (The controller 116 may also change the width of the ClkIn signal or its duty cycle).

Thus, because m was measured to be four in FIG. 6, it is seen in FIG. 7 that the PDen is high every fourth input clock pulse.

In any event, because the phase detector is only enabled at the times when PDen is high, an assessment of phase between ClkIn and ClkOut_DM, and subsequent output of an UP or DN signal, is affected only during those limited times, e.g., during windows 150. Again, these windows 150 are assessed in accordance with the loop frequency (i.e., 1/tML~1/tLoop), and not in accordance with the clock frequency (1/tCK) as in the prior art. This keeps the loop from overreacting, such as in FIG. 4, where several UP signals were generated, and VDLctrl continually modified, before it was even assessed whether such phase adjustment control signals were warranted. As a result, and as shown in FIG. 7, using the disclosed technique, the timing error, tER, will converge and not oscillate. (This assumes that the gain in the loop is not too large. The loop gain can be optimized, as one skilled in the art will appreciate, and in any event can be made higher than conventional loops not using embodiments of the disclosed invention). Thus, the effect of long delay through the delay module, tDM, are overcome by in effect measuring that delay as part of the loop delay, and taking that measured delay into account when generating control signals at the phase detector.

Figure 9:
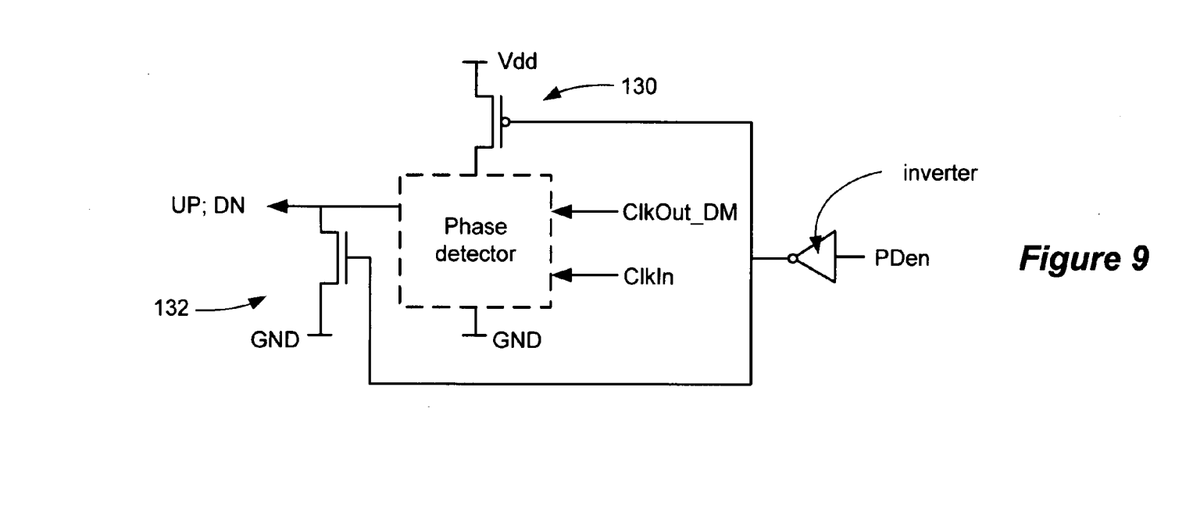
FIG. 9 illustrates exemplary circuitry for selectively enabling the phase detector using an enable signal (PDen).

Selective enablement of the phase detector via the PDen signal can be achieved in several different ways, as one skilled in the art will appreciate. In one simple way, shown in FIG. 9, the UP and DN signal outputs are grounded (via N-channel transistor 132) during those periods when PDen is not low, corresponding to a command that tVDL not be adjusted. During such time, connection of the circuits in the phase detector to the power supply voltage, Vdd, are disconnected (via P-channel transistors 130) to ensure no power-to-ground shorts.

It should be understood from this disclosure that frequency with which the phase detector is activated need not exactly match the loop delay. Thus, as shown in FIG. 6, the loop delay, tLoop, is smaller than the measured value, tML, ultimately used to adjust the frequency of phase detector. This results due to the convenience of counting input clock pulses as an estimation of loop delay. In this regard, it should be understood that the frequency of the phase detector need (1/tML) only substantially correspond to the loop frequency (1/tLoop) in a preferred embodiment. In a less-preferred, but still beneficial embodiment, the phase detector is operated at a frequency which is somewhere between the clock frequency and the loop frequency. For example, suppose in FIG. 7 that the phase detector is enabled (via PDen) every other clock pulse (instead of every fourth as shown). Even thought this would amount to some, amount of overreaction of the loop because not all phase adjustment commands will have had a chance to percolate through the loop to have effect before new commands are entered—the effect and stability of the loop will still be improved when compared with the prior art.

The measuring step can occur in an integrated circuit in which the DLL is used upon chip reset or initialization, or can be measured periodically during operation of the integrated circuit to ensure that the measured loop frequency is still optimal.

Although the disclosed phase detector has been shown separate from the loop filter, it should be understood that use of the term "phase detector" can comprise the loop filter aspects of the circuitry as well (if any).

While a preferred embodiment of the invention has been disclosed, it should be understood the circuitry used to affect the frequency conversion of the enablement of the phase detector can be achieved in many different ways. In short, it should be understood that the inventive concepts disclosed herein are capable of many modifications. To the extent such modifications fall within the scope of the appended claims and their equivalents, they are intended to be covered by this patent.

What is claimed is:

1. A circuit for generating an output clock signal from an input clock signal having a clock frequency, comprising:
   a loop having a loop frequency, wherein the loop frequency comprises the inverse of a loop delay, and wherein the loop delay comprises a time it takes for a signal to pass through the loop, the loop comprising:
      a detector circuit for, when enabled, outputting a representation of a phase difference between the input clock signal and a delayed version of the output clock signal;
      a variable delay circuit for receiving the representation of the phase difference, and for outputting the output clock signal; and
      a fixed delay circuit for receiving the output clock signal and for outputting the delayed version of the output clock signal;
   wherein the detector circuit is selectively enabled at a frequency substantially equal to the loop frequency.

2. The circuit of claim 1, further comprising a controller for selectively enabling the detector circuit, wherein the controller stores a value indicative of a ratio between the loop and clock frequencies.

3. The circuit of claim 2, wherein the controller further comprises a counter for determining the value.

4. The circuit of claim 1, wherein the loop frequency is smaller than the clock frequency.

5. The circuit of claim 1, wherein the loop delay is a measured value.

6. The circuit of claim 1, wherein the detector circuit comprises a phase detector and a loop filter.

7. A circuit for generating an output clock signal from an input clock signal having a clock frequency, comprising:
   a loop, comprising in series:
      a detector circuit for outputting a representation of a phase difference between the input clock signal and a delayed version of the output clock signal,
      a variable delay circuit for receiving the representation of the phase difference, and for outputting the output clock signal, wherein the output clock signal has the clock frequency, and
      a fixed delay circuit for receiving the output clock signal and for outputting the delayed version of the output clock signal, wherein the delayed version of the output clock signal has the clock frequency; and
   a controller for sending signals to the detector circuit to selectively enable the detector circuit, wherein the controller selectively enables the detector circuit in accordance with a frequency lower than the clock frequency but higher than or substantially equal to a loop frequency, wherein the loop frequency determined in accordance with a propagation delay through the loop.

8. The circuit of claim 7, wherein the loop frequency is smaller than the clock frequency.

9. The circuit of claim 7, wherein the controller selectively enables the detector circuit in accordance with the loop frequency.

10. The circuit of claim 7 wherein the loop delay is a measured value.

11. The circuit of claim 7, wherein the controller comprises a counter for determining the loop frequency as a value during a loop measurement period.

12. The circuit of claim 11, wherein the controller derives the signals from the input clock signal.

13. The circuit of claim 12, wherein the controller derives the signals by frequency dividing the input clock signal by the value.

14. A circuit for generating an output clock signal from an input clock signal having a clock frequency, comprising:
- a loop for receiving the input clock signal and outputting the output clock signal, the loop having a loop delay that is at least partially adjustable depending on a representation of a phase difference between representations of the input clock signal and the output clock signal, wherein the loop delay comprises a time it takes for a signal to travel through the loop, the loop delay being the inverse of a loop frequency; and
- a detector circuit in the loop for outputting the representation of the phase difference, wherein the detector circuit outputs the representation of the phase difference at a frequency substantially equal to the loop frequency.

15. The circuit of claim 14, wherein the loop frequency is smaller than the clock frequency.

16. The circuit of claim 14, wherein the loop delay is a measured value.

17. The circuit of claim 14, wherein the detector circuit outputs the representation of the phase difference by being selectively enabled at the frequency substantially equal to the loop frequency.

18. The circuit of claim 17, wherein the detector circuit is selectively enabled by a controller.

19. The circuit of claim 18, wherein the controller selectively enables by frequency dividing the input clock signal.

20. The circuit of claim 14, wherein the detector circuit comprises a phase detector and a loop filter.

21. A delay or phase locked loop circuit for generating an output clock signal from an input clock signal having a clock frequency, comprising:
- a loop for receiving the input clock signal and outputting the output clock signal, the loop having a delay that is at least partially adjustable depending on receipt of a representation of a phase difference between representations of the input clock signal and the output clock signal, the loop delay being the inverse of a loop frequency; and
- a detector circuit for outputting the representation of the phase difference; and
- a detector controller for selectively enabling the detector circuit at a frequency lower than the clock frequency but higher than or substantially equal to the loop frequency.

22. The circuit of claim 21, wherein the loop delay is a measured value.

23. The circuit of claim 21, wherein the detector circuit outputs the representation of the phase difference by being selectively enabled substantially in accordance with the loop frequency.

24. The circuit of claim 21, wherein the controller selectively enables by frequency dividing the input clock signal.

25. A method using a loop for generating an output clock signal from an input clock signal having a clock frequency, comprising:
- measuring a propagation delay through a loop to determine a loop frequency, wherein the propagation delay measurement comprises a time it takes to pass a signal through the loop; and
- after the propagation delay measurement, enabling a detector circuit substantially in accordance with the loop frequency, wherein the detector circuit outputs a representation of a phase difference between the input clock signal and a representation of the output clock signal so as to adjust a delay in the loop.

26. The method of claim 25, wherein measuring the propagation delay comprises counting a number of input clock cycles during the time that it takes the signal to pass through the loop.

27. The method of claim 26, wherein the number of input clock cycles is stored in a register.

28. The method of claim 27, wherein enabling the detector circuit substantially in accordance with the loop frequency comprises generating a detector enable signal derived by frequency dividing the input clock signal by the number of input clock cycles.

29. The method of claim 25, wherein the representation of the phase difference comprises an analog signal.

30. The method of claim 25, wherein the representation of the phase difference comprises digital pulses signifying that the delay needs to be adjusted up or down.

31. A method using a loop for generating an output clock signal from an input clock signal, comprising:
- measuring the delay through the loop to determine a loop frequency; and
- outputting from a phase detector a representation of a phase difference between the input clock signal and a representation of the output clock signal so as to adjust a delay in the loop, wherein the representation of the phase difference is output on less than every cycle of the input clock signal and substantially in accordance with the loop frequency, and wherein the input clock signal and the output clock signal have the same clock frequency.

32. The method of claim 31, wherein the representation of the phase difference is output substantially in accordance with a loop frequency indicative of a propagation delay of a pulse through the loop.

33. A method for generating an output clock signal from an input clock signal having a clock frequency, the method using a feedback loop, comprising:
- outputting a representation of a phase difference between the input clock signal and a delayed version of the output clock signal, wherein the representation is output at a frequency substantially equal to a loop frequency, wherein the loop frequency is determined as the inverse of a propagation delay through the feedback loop;
- receiving the representation of the phase difference at a variable delay circuit that outputs the output clock signal; and
- receiving the output clock signal at a fixed delay circuit that outputs the delayed version of the output clock signal.

34. A circuit for generating an output clock signal form an input clock signal having a clock frequency, comprising:
- a loop, comprising in series:
    - a detector circuit for outputting a representation of a phase difference between the input clock signal and a delayed version of the output clock signal,
    - a variable delay circuit for receiving the representation of the phase difference, and for outputting the output clock signal, wherein the output clock signal has the clock frequency, and
    - a fixed delay circuit for receiving the output clock signal and for outputting the delayed version of the output clock signal, wherein the delayed version of the output clock signal had the clock frequency; and
- a controller for sending signals to the detector circuit to selectively enable the detector circuit, wherein the controller comprises a counter for determining the loop frequency as a value during a loop measurement period.

* * * * *

UNITED STATES PATENT AND TRADEMARK OFFICE
CERTIFICATE OF CORRECTION

| | | |
|---|---|---|
| PATENT NO. | : 7,355,464 B2 | Page 1 of 1 |
| APPLICATION NO. | : 11/124743 | |
| DATED | : April 8, 2008 | |
| INVENTOR(S) | : Lee | |

It is certified that error appears in the above-identified patent and that said Letters Patent is hereby corrected as shown below:

In column 6, line 61, in Claim 10, after "claim 7" insert -- , --.

In column 8, line 48, in Claim 34, delete "form" and insert -- from --, therefor.

In column 8, line 60, in Claim 34, delete "had" and insert -- has --, therefor.

Signed and Sealed this

Twenty-fourth Day of June, 2008

JON W. DUDAS
*Director of the United States Patent and Trademark Office*